United States Patent [19]

Aoki et al.

[11] 4,366,554
[45] Dec. 28, 1982

[54] I²L MEMORY DEVICE

[75] Inventors: Kiyoshi Aoki; Kazuaki Ichinose, both of Yokohama, Japan

[73] Assignee: Tokyo Shibaura Denki Kabushiki Kaisha, Kawasaki, Japan

[21] Appl. No.: 198,953

[22] PCT Filed: Sep. 4, 1979

[86] PCT No.: PCT/JP79/00235
§ 371 Date: Jun. 3, 1980
§ 102(e) Date: Jun. 3, 1980

[87] PCT Pub. No.: WO80/00761
PCT Pub. Date: Apr. 17, 1980

[51] Int. Cl.³ .................................... G11C 11/40
[52] U.S. Cl. .................................... 365/155; 365/156; 365/174
[58] Field of Search ............... 365/154, 155, 156, 174, 365/181

[56] References Cited
U.S. PATENT DOCUMENTS 3,986,178 10/1976 McElroy et al. .................. 365/181
4,081,697 3/1978 Nakano .............................. 365/154
4,228,525 10/1980 Kawarada et al. ................. 365/174

FOREIGN PATENT DOCUMENTS 49-24329 3/1974 Japan .
50-50832 5/1975 Japan .
52-52337 4/1977 Japan .

Primary Examiner—Stuart N. Hecker
Attorney, Agent, or Firm—Oblon, Fisher, Spivak, McClelland & Maier

[57] ABSTRACT

A semiconductor memory device is provided which includes a first transistor (TR1) having its emitter grounded, a second transistor (TR2) having its base and collector connected to the collector and base of the first transistor (TR1) and its emitter grounded, a data line (DL), and a third transistor (TR5) having its emitter-to-collector path connected between the data line (DL) and the base of the second transistor (TR2). The semiconductor memory device further includes a fourth transistor (TR6) having its base connected to another collector of the second transistor (TR2) and a fifth transistor (TR7) having its emitter-to-collector path connected between the base of the fourth transistor (TR6) and the row select line. Data is written through the data line (DL) and third transistor (TR5) and stored data is read out of the collector of the fourth transistor according to the conduction state of the second transistor (TR2).

18 Claims, 12 Drawing Figures

I²L MEMORY DEVICE

TECHNICAL FIELD

This invention relates to a semiconductor memory device constituted of a plurality of transistors.

BACKGROUND ART

An IIL logic circuit which requires no separation for each element has recently been used to enhance the integration density of an integrated circuit. Japanese Patent Disclosure No. 49-24329 discloses a semiconductor memory device having a plurality of flip-flop type memory cells constructed with the use of an IIL logic circuit of this type and arranged in a matrix array. In this type of semiconductor memory device, read and write operations are selectively effected through the same address transistor with respect to each memory cell. In this case, a data output signal read out of the memory cell through the address transistor does not have a sufficiently great logic amplitude and in order to positively detect the data output signal a data detection circuit of a complicated structure is needed, making the occupation area of the memory device greater as a whole.

It is accordingly an object of this invention to provide a semiconductor memory device which reads out memory data as a logic signal having a sufficiently great logic amplitude and positively processes data without using a complicated data detection circuit.

DISCLOSURE OF INVENTION

This invention provides a semiconductor memory device having at least one flip-flop type memory cell comprising a first transistor, a second transistor having the same conductivity type as that of the first transistor and having its emitter, collector and base connected to the emitter, base and collector of the first transistor, a third transistor having its base and collector connected to the emitter and collector of the first or the second transistor, and a fourth transistor having its emitter and base connected to the emitter and collector of the second transistor. The memory content of the flip-flop type memory cell is read out by applying readout voltage to the base of the fourth transistor. That is, since with the second transistor ON the collector potential of the second transistor and base potential of the fourth transistor become equal to a reference potential, the fourth transistor is held in a nonconductive state and an output data signal of a first logic level is obtained through an output data line connected to the collector of the fourth transistor. With the second transistor OFF the fourth transistor is rendered conductive and an output data signal of a second logic level is obtained through the output data line. Since in this way the contents of the flip-flop type memory cell is read out according to the ON and OFF states of the fourth transistor the logic amplitude of the output data signal can be made greater. This obviates the need for using a complicated data detection circuit.

BEST MODE OF CARRYING OUT THE INVENTION

Figure 1:
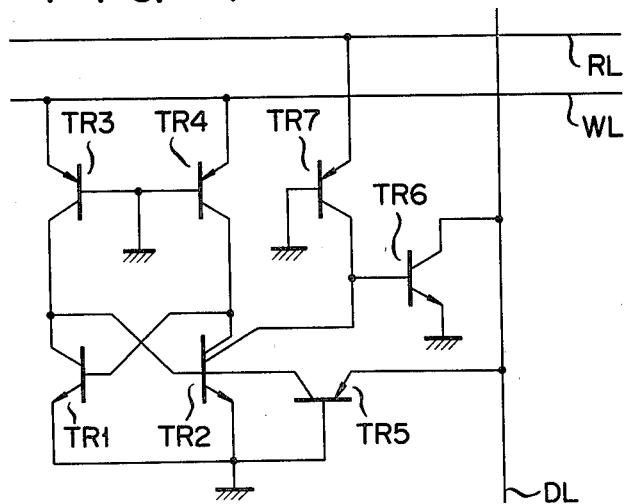
FIG. 1 shows a circuit diagram of a semiconductor memory device according to one embodiment of this invention.

A semiconductor memory circuit according to one embodiment of this invention includes, as shown in FIG. 1, an NPN transistor TR1 having a grounded emitter and an NPN transistor TR2 having a grounded emitter and a base and first collector connected to the collector and base, respectively, of the transistor TR1. The collectors of the transistors TR1 and TR2 are connected to a first row select line i.e. a word line WL through the collector-emitter paths of PNP transistors TR3 and TR4, acting as load impedance elements, whose bases are grounded. The base of the transistor TR2 is connected to the collector of a PNP transistor TR5 having its base grounded and its emitter connected to a data line DL. The transistor TR2 has a second collector connected to the base of an NPN transistor TR6 having a grounded emitter and a collector connected to the data line DL. The second collector of the transistor TR2 is connected to a second row select line RL through the collector-emitter path of a PNP transistor TR7 having its base grounded.

Figure 2:
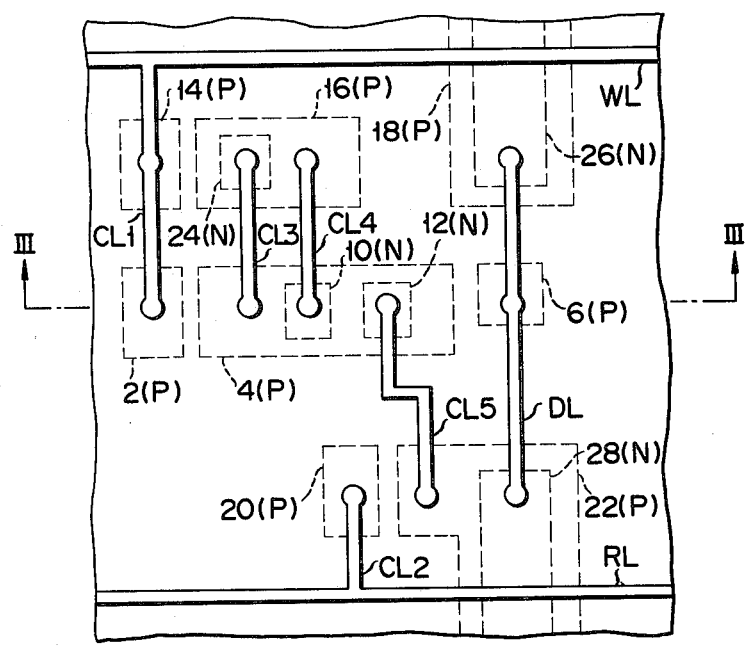
FIG. 2 is a plan view showing the semiconductor memory device embodying the circuit of FIG. 1.
Figure 3:
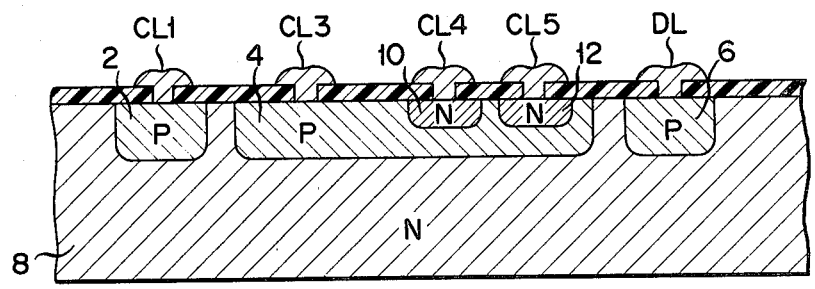
FIG. 3 is a cross-sectional view, as taken along line III—III in FIG. 2, showing the semiconductor memory device of FIG. 2.

FIGS. 2 and 3 show a detailed arrangement of the semiconductor memory circuit shown in FIG. 1.

FIG. 3 is a cross-sectional view as taken along line III—III of the semiconductor memory device shown in FIG. 2. As shown in FIGS. 2 and 3, P-conductivity type semiconductor regions, 2, 4 and 6 are formed on the surface region of an N-conductivity type substrate 8. N-conductivity type regions 10 and 12 are formed on the P-type region 4. As shown in FIG. 2, P-conductivity type regions 14, 16, 18, 20 and 22 are formed on the surface area of a substrate 8. N-conductivity type regions 24 and 26 are formed in the P-type regions 16 and 18, respectively, and an N-conductivity type region 28 is formed in the P-type region 22. The P-type regions 2 and 14 are connected through a connection line CL1 to the word line WL and the P-type region 20 is connected through a connection line CL2 to the second row select line RL. The P-type region 4 and N-type region 24 is interconnected by a connection line CL3, the P-type region 16 is connected by a connection line CL4 to the N-type region 10, the N-type region 12 is connected by a connection line CL5 to the P-type region 22 and the P-type region 6 is connected by the data line DL to the N-type regions 26 and 28.

The emitter, base and collector of the transistor TR1 shown in FIG. 1 are constituted of the N-type substrate 8, P-type region 16 and N-type region 24, the emitter, base and first and second collectors of the transistor TR2 are constituted of the N-type substrate 8, P-type region 4 and N-type regions 10 and 12, the transistor TR3 is constituted of the P-type region 2, N-type substrate 8 and P-type region 4 and the transistor TR4 is constituted of the P-type region 14, N-type substrate 8 and P-type region 16. The transistor TR5 is constituted of the P-type region 6, N-type substrate 8 and P-type region 4, the transistor TR6 is constituted of the N-type substrate 8, P-type region 22 and N-type region 28 and the transistor TR7 is constituted of the P-type region 20, N-type substrate 8 and P-type region 22. Note that in a semiconductor memory device shown in FIG. 2 the P-type region 18 and N-type region 26 are formed integral with P- and N-type regions in an adjacent memory cell which are formed in a manner to correspond to the P-type region 22 and N-type region 28. Therefore, the data line DL is arranged without crossing the first and second row select lines WL and RL, permitting the word line WL and data line DL to be formed in the same connecting step and permitting a smaller chip area. Where memory cells adjacent in a row direction are formed in a symmetrical fashion, in P-type regions 2, 14 and 20 can be commonly used for the adjacent two memory cells.

As evident from FIGS. 1 to 3, the transistors TR1 and TR4 constitute a first IIL logic gate circuit, the transistors TR2, TR3 and TR5 constitute a second logic gate circuit, and the transistors TR6 and TR7 constitute a third IIL logic gate circuit.

In this embodiment, as clearly shown in FIG. 2 the transistor TR2 is so constructed that it has a base area greater than that of the transistor TR1. In consequence, the transistor TR2 has an inherent electrostatic capacity greater than that of the transistor TR1 and, when bias voltage is applied such that under the same conditions the transistors TR1 and TR2 are rendered conductive, the transistor TR1 is first rendered conductive.

Figure 4:
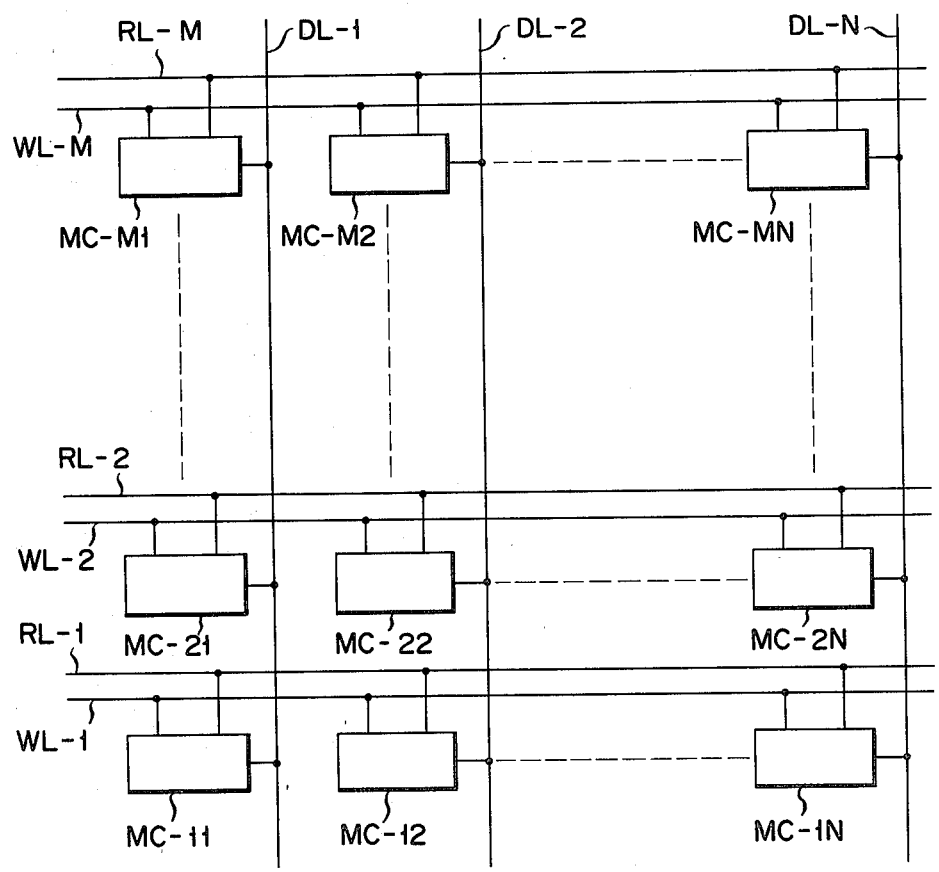
FIG. 4 is a block diagram showing a semiconductor memory device including a plurality of flip-flop type memory cells arranged in a matrix array.

FIG. 4 shows a semiconductor memory apparatus in which a plurality of memory cells MC-11 to MC-MN comprised of the transistor TR1 to TR7 in FIG. 1 are arranged in a matrix array. The read/write operation to the memory cells MC-11 to MC-MN is executed by selectively energizing the first row select lines WL-1 to WL-M, second row select lines RL-1 to RL-M and data lines DL-1 to DL-N.

The operation of the semiconductor memory device as shown in FIGS. 1 to 4 will be explained below.

In a normal operation time, the first row select lines WL-1 to WL-M are held at a high level potential, for example, 0.7 V and the second row select lines RL-1 to RL-M are held at a low level potential, for example, 0 V. When data is written into the memory cell constituted of the transistors TR1 to TR7 a potential on a desired first row select line is first switched to a low level and the other first row select line is held at a high level potential. When, for example, data "1" is written into the memory cell, a "1" level data signal is supplied to the corresponding data line DL. The "1" level data signal is applied to the base of the transistor TR2 through an emitter-to-collector path of the transistor TR5. If in this state the potential on the desired first row select line is switched to a high level, the transistor TR2 is rendered in the conductive state and the transistor TR1 is held in the nonconductive state. In this way, the data "1" is written into the memory cell. When, on the other hand, data "0" is written into the memory cell, a "0" level data signal is supplied to the corresponding data line DL. When thereafter the potential on the desired first row select line is switched to a high level, since as mentioned above the base area of the transistor TR2 is greater than that of the transistor TR1, the transistor TR1 is first rendered conductive and the transistor TR2 is held at the nonconductive state. By doing so, the data "0" is written into the memory cell. By setting the potential on the selected first row select line to a low level and thereafter returning it to a high level, data corresponding to a data signal on the data line is written into the memory cell.

When data is read out of the memory cell, a desired second row select line is set to a high level potential, the other second row select line is held at a low level potential and the corresponding data line is held at a high level. When data "1" is stored in the memory cell i.e. when the transistor TR2 is held in the conductive state, the base of the transistor TR6 is held at a ground potential. Even if, therefore, the second row select line is set to a high level, the transistor TR6 is held in the nonconductive state and a high level signal on the data line is supplied as a "1" signal to an output device (not shown). Where, on one hand, data "0" is written into the memory cell i.e. the transistor TR2 is held in the nonconductive state, if the second row select line is set to a high level, a high level voltage is applied to the base of the transistor TR6 to cause the transistor TR6 to be turned ON. By so doing, the potential on the data line is equal to the ground potential and a low level signal on the data line is supplied as a "0" signal to the output device.

It is important to note that since the transistors TR6 and TR7 constitute an IIL logic gate circuit data signal derived from the collector of the transistor TR6 becomes a low level or a high level according to the memory data "0" and "1" of the memory cell and data read out of the memory cell can be positively detected without any complicated data detection circuit.

Figure 5:
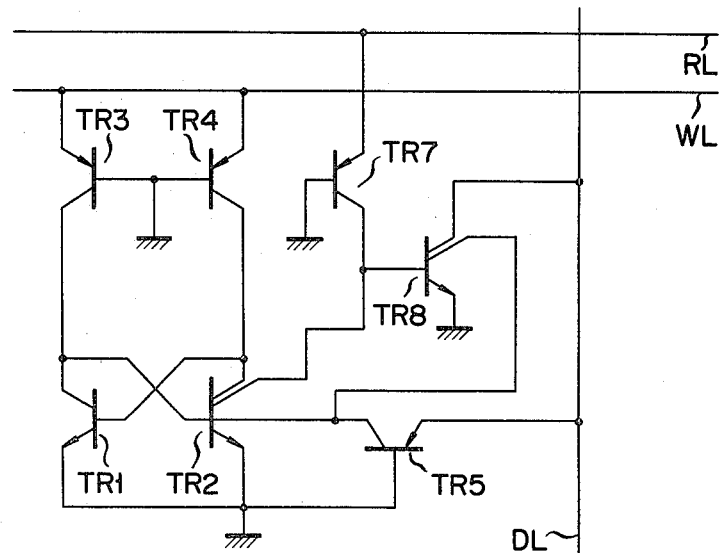
FIGS. 5 and 6 are a circuit diagram and plan view, respectively, showing another embodiment of this invention.
Figure 6:
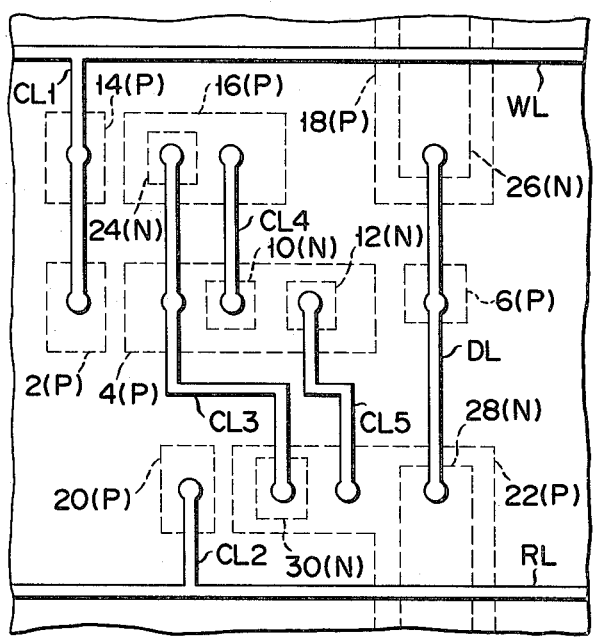

FIGS. 5 and 6 show another embodiment of this invention. This embodiment is similar in its arrangement to the above-mentioned embodiment except that use is made, in place of the transistor TR6, of a PNP transistor TR8 having its base and emitter connected to the collector and emitter of the transistor TR2, its first collector connected to the data line DL and its second collector connected to the base of the transistor TR2, that is, as shown in FIG. 6 an N-type region 30 is formed in the P-type region 22 to permit the N-type region 30 to be connected to the P-type region 4.

Where a write operation is executed in the semi-conductor memory apparatus shown in FIGS. 5 and 6, a desired first row select line is set at a low level potential and the second row select lines RL-1 to RL-M are temporarily set to a high level with the other first row select lines held at the high level potential. By doing so, the transistor TR8 is rendered conductive, the collector potential of the transistor TR6 becomes equal to a ground potential and the base potential of the transistor TR2 is compulsorily made equal to the ground potential. In this way, a positive data writing operation is carried out. That is, where in the memory circuit shown in FIG. 1 data "0" is written into the memory cell being stored with, for example, data "1" a potential on the data line DL is set at a lower level to make the transistor TR2 rendered nonconductive. Even if the potential on the data line DL is set at a low level it takes a relatively long time, due to the presence of the inherent electrostatic capacity of the transistor, to cause the base potential of the transistor TR2 to become a sufficiently low level. If the first row select line WL is set to a high level potential before the base potential of the transistor TR2 becomes sufficiently low, the transistor TR2 becomes first conductive and there is a possibility that the data "1" will be again written. In the embodiment shown in FIG. 5, such a problem is effectively solved by setting the base potential of the transistor TR2 compulsorily at a ground potential at the earlier portion of the writing operation time, leading to a greater improvement in the operation speed of the memory. Further, a high integration density can be held by constructing the semiconductor device as shown in FIG. 6.

Figure 7:
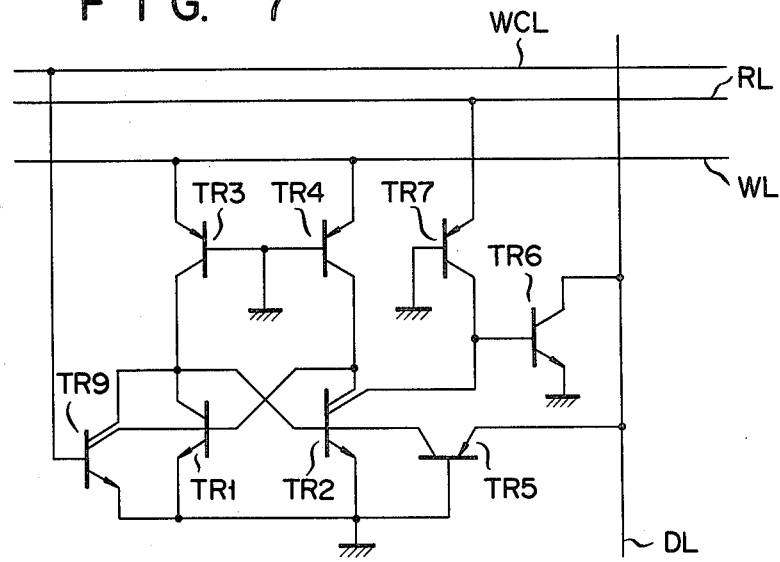
FIG. 7 shows a semiconductor memory circuit according to another embodiment of this invention.

FIG. 7 shows a circuit diagram of a semiconductor device according to another embodiment of this invention. This semiconductor memory circuit is the same as the semiconductor memory device shown in FIG. 1 except that it has a write control line WCL arranged for each row and an NPN transistor TR9 having its first and second collectors connected to the bases of transistors TR1 and TR2, respectively, its emitter connected to the emitter of the transistor TR2 and its base connected to the write control line. Where in the semiconductor memory circuit shown in FIG. 7 a write operation is carried out, a desired first row select line is set at a low level potential and with another first low select line held at a high level potential the write control line WCL for each row is set temporarily at a high level. By so doing, the transistor TR9 is rendered conductive and the bases of the transistors TR1 and TR2 are set at a ground potential. In this way, the semiconductor memory circuit shown in FIG. 7 has the same effect as that of the semiconductor memory circuit shown in FIG. 5. Note that in the circuit shown in FIG. 7 the first collector of the transistor TR9 may be omitted.

Figure 8:
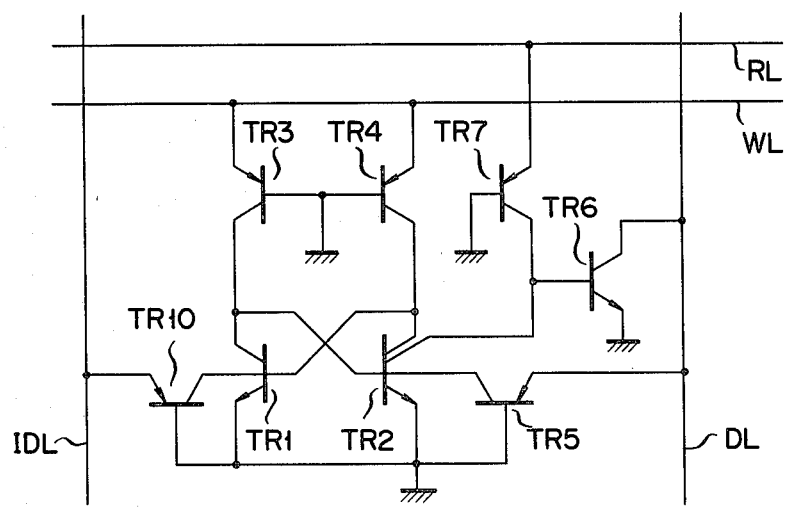
FIGS. 8 and 9 are a circuit diagram and plan view, respectively, showing a semiconductor memory device according to another embodiment of this invention.
Figure 9:
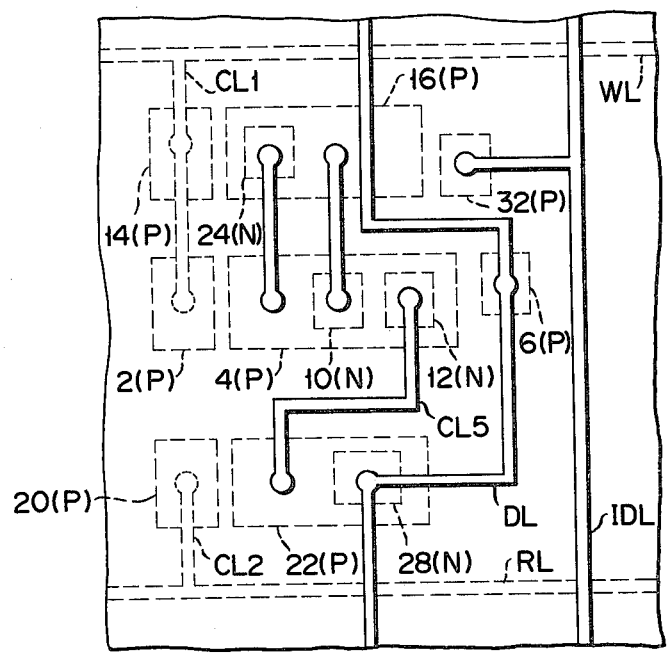

FIGS. 8 and 9 show a circuit arrangement of a semiconductor memory according to another embodiment of this invention. This semiconductor memory circuit is substantially similar to the semiconductor memory circuit shown in FIG. 1 except that it has a pair of data lines DL, IDL supplied with data having a mutually inverting relation and a PNP transistor TR10 having its emitter connected to the data line IDL, its base connected to the emitter of a transistor TR2 and its collector connected to the base of a transistor TR1. The emitter, base and collector of the transistor TR10 are formed of a P-type region 32, N-type substrate 8 (FIG. 2) and P-type region 16, respectively. Where in the semiconductor memory circuit shown in FIGS. 8 and 9 a writing operation is effected, a desired row select line is set at a low potential level and with another first row select line held at a high potential level data "0" and "1" are supplied to the data lines DL and IDL and the transistors TR1 and TR2 are rendered selectively conductive according to the data. In this embodiment, therefore, it is not required that the transistors TR1 and TR2 be constructed such that the transistors TR1 and TR2 have a different base area as in the embodiment shown in FIGS. 1 to 4.

Although this invention has been explained in connection with several embodiments, it is not restricted to these embodiments. In the semiconductor memory circuit shown in FIGS. 1 and 5, in order that the time required for the transistor TR2 to be rendered conductive may be made longer than the time required for the transistor TR1 to be rendered conductive, the transistor TR2 is constructed such that it has a base area greater than that of the transistor TR1. Even if the other dimension, for example the collector area, of the transistors TR1 and TR2 is varied, the same result can be obtained. With the transistors TR1 and TR2 constructed in substantially the same way and the inherent electrostatic capacities of the transistors TR1 and TR2 made equal to each other, the same result is obtained even if the impedance value of the transistor TR3 is made greater than the impedance value of the transistor TR4.

Figure 10:
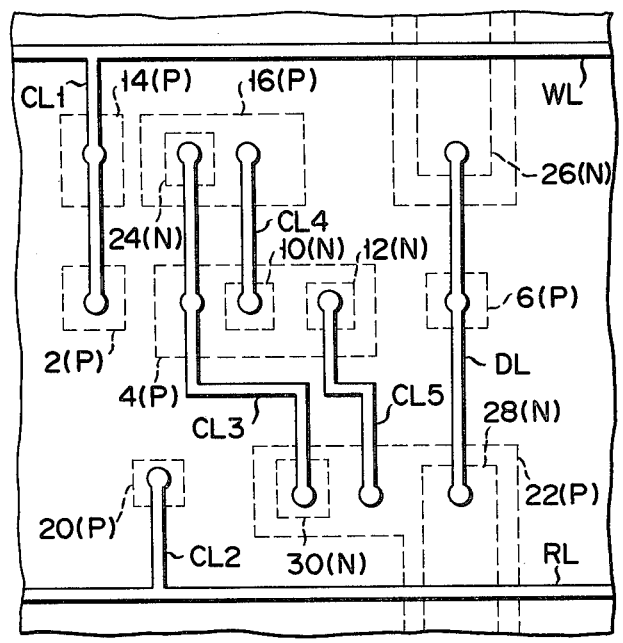
FIG. 10 shows a modified form of semiconductor memory device of FIG. 2.

This is realized as shown, for example, in FIG. 10 by making the confronting area of the P-type regions 2 and 4 smaller than the confronting area of the P-type regions 14 and 16, or making a distance between the P-type regions 2 and 4 i.e. the base width of a transistor TR3 greater than a distance between the P-type regions 14 and 16 i.e. the base width of a transistor TR4. By making, as shown in FIGS. 2, 6, 9 and 10, the confronting area of the P-type regions 6 and 4 smaller than the confronting area of the P-type regions 2 and 4 or making a distance between the P-type regions 6 and 4 i.e. the base width of the transistor TR5 greater than a distance between the P-type regions 2 and 4 i.e. the base width of the transistor TR3, when data "0" is read out of the memory a current flowing from the unselected other memory cells into the data line DL can be made minimal, leading to an effective stabilization of a reading operation.

By making, as shown in FIG. 10, the confronting area of the P-type regions 20 and 22 smaller or making a distance between the P-type regions 20 and 22 i.e. the base width of the transistor TR7 greater to cause the base-ground current amplification factor in the reverse operation of the transistor TR7, an influence suffered by the collector current of the transistor TR7 according to the memory contents of the other memory cell arranged on the same row is restricted to a minimal level.

Figure 11:
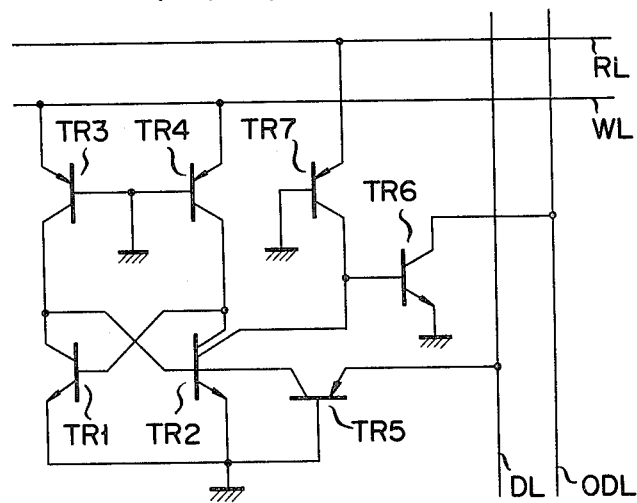
FIG. 11 shows a modified form of semiconductor memory device shown in FIG. 1.
Figure 12:
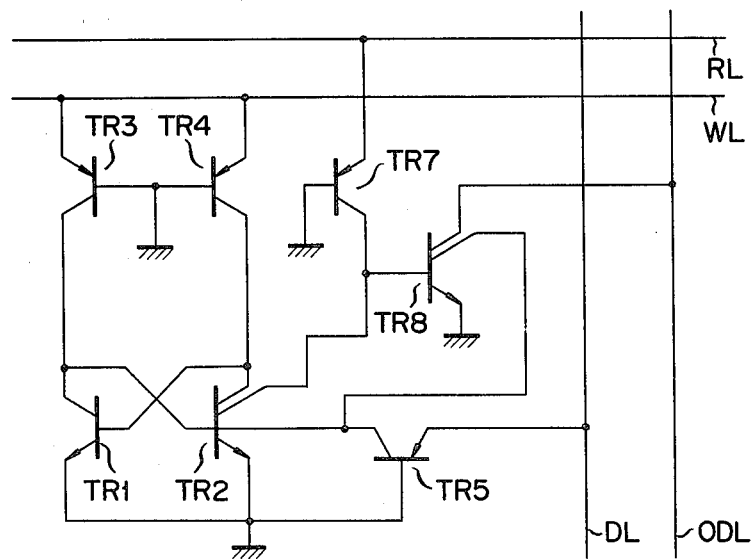
FIG. 12 shows a modified form of semiconductor memory device shown in FIG. 1.

Although in the embodiment as shown in FIGS. 1, 5, 7 and 8 the base of the transistor TR6 and collector of the transistor TR7 are connected to the second collector of the transistor TR2, a second collector may be formed on the transistor TR1 and the base of the transistor TR6 and collector of the transistor TR7 be connected to the second collector of the transistor TR1. While in the above-mentioned embodiment the collector of the transistor TR6 is connected to the data line DL, as shown in FIGS. 11 and 12 for example, an output data line ODL may be arranged separately from the data line DL and the collector of the transistor TR6 and TR8 may be connected to the output data line ODL.

In the above-mentioned embodiment it is possible to invert the polarity of the transistor used.

We claim:

1. A semiconductor memory device comprising a first transistor (TR1) of a first conductive type, a second transistor (TR2) of the first conductivity type having its emitter, collector and base respectively connected to the emitter, base and collector of the first transistor (TR1), a third transistor (TR5) of a second conductivity type opposite to said first conductivity type which has its emitter, base and collector respectively connected to a data line (DL) and the emitter and base of the second transistor (TR2), and first and second impedance elements (TR3, TR4) having their first ends respectively connected to the collectors of the first and second transistors (TR1, TR2) and their second ends commonly connected to a first row select line (WL), a fourth transistor (TR6 or TR8) of the first conductivity type having its base and emitter respectively connected to the collector and emitter of one of the first and second transistors (TR1, TR2) and a third impedance element (TR7) having its one end connected to the base of the fourth transistor (TR6 or TR8) and its other end connected to a second row select line (RL), said second row select line (RL) being selectively energized to supply a base current towards the base of the fourth transistor (TR6 or TR8), thus permitting the fourth transistor (TR6 or TR8) to be rendered conductive or nonconductive in accordance with the conduction state of the second transistor (TR2).

2. A semiconductor memory device according to claim 1, in which said first transistor (TR1) has a base area smaller than that of said second transistor (TR2).

3. A semiconductor memory device according to claim 1, in which said first impedance element (TR3) has a value greater than that of said second impedance element (TR4).

4. A semiconductor memory device according to any one of claims 1 to 3, in which said first and second impedance elements (TR3, TR4) are constituted of transistors of the second conductivity type having their emitters connected to each other, their bases connected to each other and their collectors connected to the collectors of said first and second transistors (TR1, TR2).

5. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), and first and second impedance elements (TR3, TR4) having their first ends connected to the collectors of the first and second transistors (TR1, TR2) and their second ends connected to each other; and further including a fourth transistor (TR6, TR8) of the first conductivity type having its base and emitter connected to the collector and emitter of one of the first and second transistors (TR1, TR2) and its collector connected to the base of said second transistor (TR2) and a third impedance element having its one end connected to the base of the fourth transistor (TR6, TR8).

6. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), the first and second impedance elements (TR3, TR4) having their first ends connected to the collectors of the first and second transistors (TR1, TR2) and their second ends connected to each other; a fourth transistor (TR6, TR8) of the first conductivity type having its base and emitter connected to the collector and emitter of one of the first and second transistors (TR1, TR2) and a third impedance element having its one end connected to the base of the fourth transistor (TR6), TR8) and further including a fifth transistor (TR9) of a first conductivity type having its collector-emitter path connected between the base and emitter of said second transistor.

7. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), and first and second impedance elements (TR3, TR4) having their first ends connected to the collectors of the first and second transistors (TR1, TR2) and their second ends connected to each other; and further including a fourth transistor (TR6, TR8) of the first conductivity type having its base and emitter connected to the collector and emitter of one of the first and second transistors (TR1, TR2) and a third impedance element (TR7) being comprised of a transistor of the second conductivity type having its base and collector connected to the emitter and base of said third transistor (TR6).

8. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), and first and second impedance elements (TR3, TR4) having their first ends connected to the collectors of the first and second transistors (TR1, TR2) and their second ends connected to each other; and further including a fourth transistor (TR6, TR8) of the first conductivity type having its base and emitter connected to the collector and emitter of one of the first and second transistors (TR1, TR2) and a third impedance element has its one end connected to the base of the fourth transistor (TR6, TR8), wherein said first and second impedance elements (TR3, TR4) are comprised of sixth and seventh transistors of the second conductivity type having their emitter connected to each other, their bases connected to each other and their collectors connected to the collectors of said first and second transistors (TR1, TR2), said third impedance element (TR7) is constituted of an eighth transistor of the second conductivity type having its base and collector connected to the emitter and base of said third transistor (TR6), said sixth transistor (TR3) and second transistor (TR2) constitute a first IIL logic gate circuit, said seventh transistor (TR4) and first transistor (TR1) constitute a second IIL logic gate circuit and said eighth transistor (TR7) and fourth transistor (TR6) constitute a third IIL logic gate circuit.

9. A semiconductor memory device comprising a first transistor (TR1) of a first conductivity type, a second transistor (TR2) of the first conductivity type having its emitter, collector and base respectively connected to the emitter, base and collector of the first transistor (TR1), a third transistor (TR5) of a second conductivity type opposite to said first conductivity type which has its base and collector respectively connected to the emitter and base of the second transistor (TR2), memory cells arranged in a matrix array and each constituted of first and second impedance elements (TR3, TR4) having their first ends connected to the collectors of the first and second transistors and their second ends connected to each other, a first data line (DL) commonly connected to the emitter of the third transistor (TR5) of the memory cell on the same column and a first row select line (WL) commonly connected to the second ends of the first and second impedances (TR3, TR4) of the memory cell on the same row, in which each of said memory cells comprises a fourth transistor (TR6 or TR8) of the first conductivity type having its base and emitter respectively connected to the collector and emitter of one of said first and second transistors (TR1, TR2) and a third impedance element (TR7) having one end connected to the base of the fourth transistor (TR6 or TR8) and the other end connected to a second row select line.

10. A semiconductor memory device according to claim 9, in which in each of said memory cells the transistor (TR1) has a base area smaller than that of said second transistor (TR2).

11. A semiconductor memory cell according to claim 9, in which in each of said memory cell said first impedance (TR3) has a value greater than that of said second impedance element (TR4).

12. A semiconductor memory device according to any one of claims 9 to 11, in which in each of said memory cells said first and second impedance elements (TR3, TR4) are constituted of transistors of the second conductivity type having their emitters connected to each other, their bases connected to each other and their collectors connected to the collectors of said first and second transistors (TR1, TR2).

13. A semiconductor memory cell according to any one of claims 9 to 11, further including a second data line commonly connected to the collector of the fourth transistor (TR6 or TR8) of the memory cell on the same row.

14. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), memory cells arranged in a matrix array and constituted of first and second impedance elements (TR3, TR4) having their first ends connected to the collectors of the first and second transistors and their second ends connected to each other, a first data line (DL) commonly connected to the emitter of the third transistor (TR5) of the memory cell on the same column and a first row select line (WL) commonly connected to the second ends of the first and second impedances (TR3, TR4) of the memory cell on the same row, in which each of said memory cells comprises a fourth transistor (TR6, TR8) of the first conductivity type having its base and emitter connected to the collector and emitter of one of said first and second transistor (TR1, TR2) and its collector connected to the base of said second transistor (TR2) and a third impedance element having its end connected to the base of the fourth transistor (TR6, TR8) and its other end connected to a second row select line.

15. A semiconductor memory device comprising a first transistor (TR1) of a first conductivity type, a second transisor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), memory cells arranged in a matrix array and constituted of first and second impedance elements (TR3, TR4) having their first ends connected to the collectors of the first and second transistors and their second ends connected to each other, a first data line (DL) commonly connected to the emitter of the third transistor (TR5) of the memory cell on the same column and a first row select line (WL) commonly connected to the second ends of the first and second impedances (TR3, TR4) of the memory cell on the same row, in which each of said memory cells comprises a fourth transistor (TR6, TR8) of the first conductivity type having its base and emitter connected to the collector and emitter of one of said first and second transistors (TR1, TR2), a third impedance element having its end connected to the base of the fourth transistor (TR6, TR8) and its other end connected to a second row select line and a fifth transistor (TR9) of the first conductivity type having its collector-emitter path connected between the base and emitter of said second transistor (TR2).

16. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), memory cells arranged in a matrix array and constituted of first and second impedance elements (TR3, TR4) having their first ends connected to the collectors of the first and second transistors and their second ends connected to each other, a first data line (DL) commonly connected to the emitter of the third transistor (TR5) of the memory cell on the same column and a first row select line (WL) commonly connected to the second ends of the first and second impedances (TR3, TR4) of the memory cell on the same row, in which each of said memory cells comprises a fourth transistors (TR6, TR8) of the first conductivity type having its base and emitter connected to the collector and emitter of one of said first and second transistor (TR1, TR2), and a third impedance element (TR7) having its base and collector connected to the emitter and base of said fourth transistor (TR6).

17. A semiconductor memory device comprising a first transistor (TR1) of a first conductivity type, a second transistor (TR2) of the first conductivity type having its emitter, collector and base connected to the emitter, base and collector of the first transistor (TR1), a third transistor (TR5) of a second conductivity type opposite to said first conductivity type which has its base and collector connected to the emitter and base of the second transistor (TR2), memory cells arranged in a matrix array and constituted of first and second impedance elements (TR3, TR4) having their first ends connected to the collectors of the first and second transistors and their second ends connected to each other, a first data line (DL) commonly connected to the emitter of the third transistor (TR5) of the memory cell on the same column and a first row select line (WL) commonly connected to the second ends of the first and second impedances (TR3), TR4) of the memory cell on the same row, in which each of said memory cells comprises a fourth transistor (TR6, TR8) of the first conductivity type having its base and emitter connected to the collector and emitter of one of said first and second transistors (TR1, TR2) and a third impedance element having its end connected to the base of the fourth transistor (TR6, TR8) and its other end connected to a second row select line, wherein said first and second impedance elements (TR3, TR4) are constituted of sixth and seventh transistors of the second conductivity type having their emitters connected to each other, their bases connected to each other and their collectors connected to the collectors of the first and second transistors (TR1, TR2), said third impedance (TR7) is constituted of an eight transistor of the second conductivity type having its base and collector connected to the emitter and base of said fourth transistor (TR6,), said sixth transistor (TR3) and second transistor (TR2) constitute a first IIL logic gate circuit, said seventh transistor (TR4) and first transistor (TR1) constitute a second IIL logic gate circuit, and said transistor (TR7) and fourth transistor (TR6) constitute a third IIL logic gate circuit.

18. A semiconductor memory device according to claim 17, in which the collector of the fourth transistor (TR6, TR8) in each memory cell arranged on the same column is connected to said first data line, the memory cell arranged on the same row is formed in a region between the first and second row select lines which are connected to the memory cells, the collector region of the fourth transistor in the respective memory cell is formed to traverse said second row select line connected to the memory cell and said first row select line connected to that memory cell adjacent to said memory cell which is on the same row, and said first data line is formed of a connection line arranged between said first and second row select lines connected to the memory cell to mutually connect the emitter region of the third transistor and the collector region of the fourth transistor of each of said memory cells on the same column, and the collector region of the fourth transistor of that memory cell adjacent to said memory cell which is on the same column.

* * * * *

UNITED STATES PATENT AND TRADEMARK OFFICE
CERTIFICATE OF CORRECTION

PATENT NO. : 4,366,554
DATED : December 28, 1982
INVENTOR(S) : KIYOSHI AOKI ET AL.

It is certified that error appears in the above-identified patent and that said Letters Patent is hereby corrected as shown below:

On the title page Insert:

[30] -- Foreign Application Priority Data

Oct. 3, 1978  [JP] Japan....121189/78

Oct. 3, 1978  [JP] Japan....121190/78

Oct. 20, 1978 [JP] Japan....128601/78

Oct. 20, 1978 [JP] Japan....128602/78 --

Signed and Sealed this

Twenty-ninth Day of March 1983

[SEAL]

Attest:

GERALD J. MOSSINGHOFF

Attesting Officer     Commissioner of Patents and Trademarks